United States Patent
Hagiwara et al.

(10) Patent No.: US 11,042,088 B2
(45) Date of Patent: Jun. 22, 2021

(54) METHOD FOR PRODUCING A THREE-DIMENSIONAL ARTICLE BY STEREO-LITHOGRAPHY

(71) Applicant: DWS S.R.L., Thiene (IT)

(72) Inventors: Tsuneo Hagiwara, Tokyo (JP); Satoshi Iketani, Vicenza (IT)

(73) Assignee: DWS S.R.L., Thiene (IT)

( * ) Notice: Subject to any disclaimer, the term of this patent is extended or adjusted under 35 U.S.C. 154(b) by 203 days.

(21) Appl. No.: 16/069,825

(22) PCT Filed: Jan. 27, 2017

(86) PCT No.: PCT/IB2017/050449
§ 371 (c)(1),
(2) Date: Jul. 12, 2018

(87) PCT Pub. No.: WO2017/130153
PCT Pub. Date: Aug. 3, 2017

(65) Prior Publication Data
US 2019/0011832 A1 Jan. 10, 2019

(30) Foreign Application Priority Data
Jan. 28, 2016 (IT) .................. 102016000008951

(51) Int. Cl.
| | | |
|---|---|---|
| B29C 41/02 | (2006.01) | |
| G03F 7/029 | (2006.01) | |
| G03F 7/00 | (2006.01) | |
| B29C 64/124 | (2017.01) | |
| B33Y 70/00 | (2020.01) | |
| G03F 7/027 | (2006.01) | |
| B33Y 10/00 | (2015.01) | |
| B33Y 80/00 | (2015.01) | |
| C08G 18/81 | (2006.01) | |
| B29K 33/00 | (2006.01) | |
| B29K 75/00 | (2006.01) | |
| C08G 18/67 | (2006.01) | |

(52) U.S. Cl.
CPC ............ *G03F 7/029* (2013.01); *B29C 64/124* (2017.08); *B33Y 10/00* (2014.12); *B33Y 70/00* (2014.12); *B33Y 80/00* (2014.12); *G03F 7/0037* (2013.01); *G03F 7/027* (2013.01); *B29K 2033/08* (2013.01); *B29K 2033/12* (2013.01); *B29K 2075/00* (2013.01); *C08G 18/672* (2013.01); *C08G 18/8175* (2013.01)

(58) Field of Classification Search
CPC ... B29C 64/124; B29C 64/129; B29C 64/135; B29K 2033/08; B29K 2033/12; B29K 2075/00; B33Y 10/00; B33Y 70/00; C08G 18/672; C08G 18/8175
USPC .................... 264/401; 522/90, 182
See application file for complete search history.

(56) References Cited

U.S. PATENT DOCUMENTS

| | | |
|---|---|---|
| 4,725,631 A | 2/1988 | Bastioli et al. |
| 5,886,064 A | 3/1999 | Rheinberger et al. |
| 6,413,698 B1 | 7/2002 | Tamura et al. |
| 7,141,616 B2 | 11/2006 | Hecht et al. |

(Continued)

FOREIGN PATENT DOCUMENTS

| | | |
|---|---|---|
| CA | 2371357 A1 | 9/2002 |
| CN | 103642382 A * | 3/2014 |

(Continued)

OTHER PUBLICATIONS

Translation to English via espacenet of CN 103642382 A. accessed Apr. 30, 2020 (Year: 2014).*
International Search Report regarding PCT/IB2017/050449, dated Jul. 5, 2017 (6pgs.).
Written Opinion of the International Searching Authority regarding PCT/IB2017/050449, dated Jul. 5, 2017 (8pgs.).
McClurkin, Joel E., and David W. Rosen. "Computer-aided build style decision support for stereolithography." Rapid Prototyping Journal (1998). (Year 1998).
Duintessenz Zahntech 2009; 35(9): 1144-1153.
User Instructions Deltamed e-dent 100, Jan. 7, 2010.
Safety Data Sheet Deltamed e-dent 100, Dec. 10, 2009.
Robert G. Craig et al. (2006). "Dental Materials". Ullmann's Encyclopedia of Industrial Chemistry. Weinheim: Wiley;<doi:10.1002/14356007.a08_251.pub2> (Year: 2012).

(Continued)

*Primary Examiner* — Leo B Tentoni
(74) *Attorney, Agent, or Firm* — Volpe Koenig

(57) ABSTRACT

The invention refers to a liquid photocurable resin composition for stereolithography, comprising (i) at least one radical polymerizable compound (A) represented by the following general formula (I): $R^4O$—CO—NH—$R^2$—NH—CO—O—$R^1$—O—CO—NH—$R^3$—NH—CO—$OR^4$ (I), wherein $R^1$ is a linear or branched polytetramethylene glycol residue having an average molecular weight from 200 to 3,000 g/mol; $R^2$ is a diisocyanate compound residue; $R^3$ is a diisocyanate compound residue being the same as or different from $R^2$; and $R^4$ is selected from AcrO—$CH_2$—$CH_2$—, (AcrO—$CH_2)_2$CH—, (AcrO—$CH_2)_3$C—$CH_2$—, AcrO—$CH_2$—$CHCH_3$—, AcrO—$CH_2$—$CHC_2H_5$— and (AcrO—$CH_2)_2$C($C_2H_5$)$CH_2$—, preferably from AcrO—$CH_2$—$CH_2$— and (AcrO—$CH_2)_2$CH—, more preferably is AcrO—$CH_2$—$CH_2$—; wherein Acr is $CH_2$=C(R)—CO— and R is a hydrogen atom or a methyl group; (ii) at least one radically polymerizable organic compound (B) different from compound (A); and (iii) a photosensitive radical polymerization initiator (C), wherein the content of said radical polymerizable compound (A) varies from 5% to 70% by weight based on the total amount of compounds (A) and (B). The invention further describes a corresponding stereolithographic use and method and three-dimensional articles produced therewith.

5 Claims, No Drawings

(56) References Cited

U.S. PATENT DOCUMENTS

| | | | |
|---|---|---|---|
| 2002/0012754 A1* | 1/2002 | Yamamura | B29C 33/64 427/487 |
| 2006/0052470 A1 | 3/2006 | Grech et al. | |
| 2009/0220916 A1 | 9/2009 | Fisker et al. | |
| 2010/0029801 A1 | 2/2010 | Moszner et al. | |
| 2011/0310370 A1 | 12/2011 | Rohner et al. | |
| 2012/0021383 A1* | 1/2012 | Skaria | C08G 18/672 433/219 |
| 2013/0295212 A1 | 11/2013 | Chen | |
| 2016/0184189 A1* | 6/2016 | Hagiwara | B29C 64/135 264/19 |

FOREIGN PATENT DOCUMENTS

| | | |
|---|---|---|
| DE | 101 14 290 B4 | 8/2004 |
| DE | 10 2007 010 624 A1 | 9/2008 |
| EP | 0346707 A2 | 12/1989 |
| EP | 0346707 A3 | 12/1989 |
| EP | 0348061 B1 | 10/1995 |
| EP | 0802455 | 10/1997 |
| EP | 3040046 | 7/2016 |
| GB | 1352063 A | 5/1974 |
| GB | 1465897 A | 3/1977 |
| GB | 1498421 A | 1/1978 |
| JP | H04-52042 Y2 | 12/1992 |
| JP | H05194135 A | 8/1993 |
| JP | 3419488 B2 | 4/2003 |
| JP | 2011085614 A | 4/2011 |
| WO | 2005051332 A1 | 6/2005 |
| WO | 2010045950 A1 | 4/2010 |
| WO | 2011087832 A1 | 7/2011 |
| WO | 2014078537 | 5/2014 |
| WO | 2015028855 | 3/2015 |
| WO | WO-2015028855 A1 * | 3/2015 ........... B29C 64/135 |

OTHER PUBLICATIONS

Kawaguchi et al., "Effect of Aliphatic Dimethacrylate Diluent on the Properties of UDMA Resin Systems", The Japanese Society for Dental Materials and Devices, vol. 7, No. 5 715-719 (1988).

Mikito Deguchi, Artificial Teeth Used for Dentures (Prosthetic Dental Implants) (Overview)—Manufacturing and Technology, vol. 65, No. 3 (2013).

* cited by examiner

METHOD FOR PRODUCING A THREE-DIMENSIONAL ARTICLE BY STEREO-LITHOGRAPHY

TECHNICAL FIELD

The present invention relates to a stereolithographic manufacturing method using a liquid photocurable resin composition that has especially been developed for stereolithography, to said photocurable resin composition and to a three-dimensional article produced therewith.

STATE OF THE ART

The stereolithography technology, the method for producing a three-dimensional article by repeating the steps of curing a thin layer by supplying a controlled amount of light energy (that can originate from a UV laser, a diode laser, a UV lamp, a LED lamp etc.) to the photocurable liquid resin, the distribution of the photocurable liquid resin in a thin layer on that cured thin layer and the curing step of that layer by supplying a controlled amount of light energy to the photocurable liquid resin, are known. It is described, for example, in the following Japanese Patent publications: no. JP 56-144478, no. JP 60-247515, no. JP 62-35966, and in the Patent publication no. U.S. Pat. No. 4,575,330.

Using this method, a three-dimensional article of interest can be made easily and in a relatively short time even if the shape of the article is fairly complex. With this technology very complex shaped three-dimensional articles such as parts for functionality tests, resin master parts for casting and resin master parts for moulds can be easily produced. But the surfaces of these parts obtained by stereolithography show usually roughness and steps due to the layer by layer building process and the curved curing shape produced by the laser.

When the surface of the three-dimensional article shows roughness and thus is less smooth, its appearance and its touch are not satisfying. Furthermore, when the three-dimensional article is made by a transparent resin composition, the transparency is not good because the light is scattered by the rough surface portions. In case of an outer surface of the article, one can polish this surface to make it smooth, but if the rough surface is inside of the structure it is difficult or even impossible to polish it.

The documents WO 2015/028855, U.S. Pat. No. 6,413, 698, WO 2014/078537 and EP 0 802 455 disclose a photocurable resin composition for stereolithography comprising polymerizable urethane-based compounds, mainly obtained by the reaction of organic polyisocyanate with specific methacrilate compounds. Further, the Japanese Patent publication no. 2005-336302 proposes to use a mixture of a phenol compound and a polyether polyol compound to obtain a smoother surface. In the Japanese Patent Publication no. 2008-100351, the Inventor proposed to add a specific acrylate compound to an epoxy compound based photocurable liquid resin composition and obtained a smoother surface. These liquid resin compositions described in the previously cited two documents are the mixtures of an epoxy compound and an acrylate compound which use the reactivity difference between a radically polymerizable compound and a cationically polymerizable compound.

As it is disclosed in these Japanese Patent publications no. 2005-336302 and no. 2008-100351, it is known a technology to make the cured article surface smoother by adding a specific compound in a hybrid photocurable liquid resin composition consisting of an epoxy compound and an acrylic compound. But this technology cannot be applied to a photocurable liquid resin composition consisting only of a radically polymerizable compound because this Japanese technology uses, as already said, the polymerization speed difference between radical polymerization and cationic polymerization. To eliminate or to reduce the roughness/steps between the layers, which is one of the weak points of stereolithography, it is important to improve the quality, utility and mechanical properties of the shaped article.

PRESENTATION OF THE INVENTION

An object of the present invention is to provide a method for producing three-dimensional articles, which have less roughness on their surface and need no or less polishing, by stereolithography in which a three-dimensional article is produced by curing a photocurable resin composition layer by supplying, layer by layer, a controlled amount of light energy to the photocurable liquid resin layer to be cured.

A further object of the invention is to provide a corresponding photocurable resin composition to be employed in this method and three-dimensional articles obtained therewith.

Another object of the present invention is to provide a method of producing three-dimensional articles by layer by layer stereolithography, which not only show less roughness on their surface and are smooth but which also show a good transparency.

A further object is to provide a corresponding photocurable resin composition to be employed in this method for producing articles with a good transparency and relative three-dimensional articles obtained by this method.

An important object of the present invention is to provide a liquid photocurable resin composition which is only based on a radically polymerizable compound, and not for example also on cationically polymerizable compounds, and a relative stereolithographic method and articles produced therewith.

The present Inventors have intensively studied so as to achieve the above objects. As a result, they have found that using a specific (meth)acrylic urethane compound in the photocurable resin composition for stereolithography, in which a three-dimensional article is produced by repeating the step of curing a thin layer by supplying a controlled amount of light energy to the photocurable liquid resin, supplying a further photocurable liquid resin as a thin layer adjacent to that cured thin layer, curing this further thin layer by supplying the controlled amount of light energy in the photocurable liquid resin, and repeating the forgoing steps reduces the roughness of the surface of the cured article and increases the smoothness improving appearance, touch and, in case the resin composition is transparent, the transparency of the produced three-dimensional article.

The (meth)acrylic urethane compound present in the photocurable resin composition of this invention is a urethane compound with photoreactive functional (meth)acryl groups and is at least one of the compounds represented by the following formula (I)

$R^4O-CO-NH-R^2-NH-CO-O-R^1-O-CO-NH-R^3-NH-CO-OR^4$ (I), wherein $R^1$ is a linear or branched polytetramethylene glycol residue having an average molecular weight from 200 to 3,000 g/mol; $R^2$ is a diisocyanate compound residue; $R^3$ is a diisocyanate compound residue being the same as or different from $R^2$; and $R^4$ is selected from the group consisting of 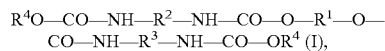 $AcrO-CH_2-CH_2-$; $(AcrO-CH_2)_2CH-$;

$(AcrO-CH_2)_3C-CH_2-$; $AcrO-CH_2-CHCH_3-$, $AcrO-CH_2-CHC_2H_5-$ and $(AcrO-CH_2)_2C(C_2H_5)CH_2-$, wherein Acr is $CH_2=C(R)-CO-$ and R is a hydrogen atom or a methyl group.

Thanks to this compound being part of the radical polymerizable liquid resin composition according to the invention, the surface of the three-dimensional article obtained by using this composition becomes more smooth with less rough portions. As a further result, the mechanical properties and the accuracy of the article are improved.

One aspect of the present invention is directed to a liquid photocurable resin composition for stereolithography, comprising:

(i) at least one radical polymerizable compound (A) represented by the following general formula (I)

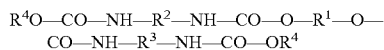
$$R^4O-CO-NH-R^2-NH-CO-O-R^1-O-\\CO-NH-R^3-NH-CO-OR^4$$

wherein $R^1$ is a linear or branched polytetramethylene glycol residue having an average molecular weight from 200 to 3,000 g/mol; $R^2$ is a diisocyanate compound residue; $R^3$ is a diisocyanate compound residue being the same as or different from $R^2$; and $R^4$ is selected from $AcrO-CH_2-CH_2-$, $(AcrO-CH_2)_2CH-$, $(AcrO-CH_2)_3C-CH_2-$, $AcrO-CH_2-CHCH_3-$, $AcrO-CH_2-CHC_2H_5-$ and $(AcrO-CH_2)_2C(C_2H_5)CH_2-$; wherein Acr is $CH_2=C(R)-CO-$ and R is a hydrogen atom or a methyl group;

(ii) at least one radically polymerizable organic compound (B) different from compound (A); and (iii) a photosensitive radical polymerization initiator (C), wherein the content of said radical polymerizable compound (A) varies from 5% to 70% by weight based on the total amount of compounds (A) and (B).

Preferably, $R^4$ is selected from $AcrO-CH_2-CH_2-$ and $(AcrO-CH_2)_2CH-$. More preferably, $R^4$ is $AcrO-CH_2-OH_2-$, Preferred $R^2$ and $R^3$ diisocyanate residues derive from the diisocyanate compounds 2,2,4-trimethylhexamethylene diisocyanate, isophorone diisocyanate, meta-xylene diisocyanate, and diphenylmethane diisocyanate, particularly preferred $R^2$ and $R^3$ diisocyanate residues derive from the diisocyanate compounds 2,2,4-trimethylhexamethylene diisocyanate and isophorone diisocyanate.

The resin according to the invention is particularly suitable for use in a method wherein a three-dimensional article is produced by curing that liquid photocurable resin composition layer by layer by irradiating selectively with light. The use of the liquid photocurable resin according to the invention in the above stereolithographic method reduces the steps between the single layers and/or surface roughness of the cured article.

In a preferred embodiment of the invention, the liquid photocurable resin composition for stereolithography according to the invention comprises 5-70 parts per weight of compound (A) and 30-95 parts per weight of compound (B) based on the total amount of 100 parts per weight of compounds (A) and (B) and further comprises 0.1-10 parts per weight of compound (C) based on the total amount of 100 parts per weight of compounds (A) and (B).

Preferably, the liquid photocurable resin composition for stereolithography according to the invention further contains, as compound (D), from 5 to 60 parts per weight based on 100 parts per weight of compounds (A), (B) and (C), one or more fillers and/or modifier resins.

Preferably, the liquid photocurable resin composition according to the invention does not contain other polymeric compounds than compounds (A) and (B), and optionally (D).

Another aspect of the invention concerns the liquid photocurable resin composition for stereolithography according to the invention which is cured and shaped into an article which has a surface roughness Ra, determined according to the JIS B0601 method, which is smaller than 0.4 µm.

Another aspect of the invention relates to the use of a compound of the following formula (I):

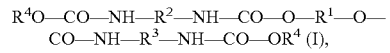
$$R^4O-CO-NH-R^2-NH-CO-O-R^1-O-\\CO-NH-R^3-NH-CO-OR^4 \text{ (I)},$$

wherein $R^1$ is a linear or branched polytetramethylene glycol residue having an average molecular weight from 200 to 3,000 g/mol; $R^2$ is a diisocyanate compound residue; $R^3$ is a diisocyanate compound residue being the same as or different from $R^2$; and $R^4$ is selected from the group consisting of $AcrO-CH_2-CH_2-$; $(AcrO-CH_2)_2CH-$; $(AcrO-CH_2)_3C-CH_2-$; $AcrO-CH_2-CHCH_3-$, $AcrO-CH_2-CHC_2H_5-$ and $(AcrO-CH_2)_2C(C_2H_5)CH_2-$, wherein Acr is $CH_2=C(R)-CO-$ and R is a hydrogen atom or a methyl group in a stereolithographic process.

Furthermore, the invention refers to a use in a stereolithographic process wherein the stereolithographic process is a layer-by-layer stereolithographic process, in particular a process comprising the steps of accommodating a to layer of a liquid photocurable resin composition comprising compound (A) in a shaping container having a light permeable bottom face and of irradiating that layer from the bottom of the container for curing the layer, and repeating these steps accommodating further layers of a liquid photocurable resin composition comprising compound (A) between the bottom of said container and the last cured layer, in order to produce a stereolithographically shaped article.

This use leads to less pronounced steps between the single layers and/or reduces surface roughness of the cured article.

More specifically, the present invention also relates to a three-dimensional article produced by stereolithography which has a smooth surface with little roughness and therefore has a good transparency.

Another aspect of the invention refers to a method for producing a three-dimensional article by stereolithography wherein the three-dimensional article is produced from a liquid photocurable resin composition according to the invention which is cured layer by layer by irradiating the layers selectively with light. The liquid photocurable resin composition according to the invention permits to reduce the steps between single layers and/or surface roughness of the cured article.

In a preferred embodiment of the invention, the method for producing a three-dimensional article comprises the steps of accommodating a layer of the liquid photocurable resin composition in a shaping container having a light permeable bottom face and of irradiating that layer from the bottom of the container, of curing the layer and of repeating these steps accommodating further layers of the liquid photocurable resin composition to be cured between the bottom of said container and the last cured layer, in order to produce a stereolithographically shaped article.

Another aspect of the invention refers to a three-dimensional article obtained from the liquid photocurable resin composition according to the invention, by the use according to the invention, or by the method according to the invention.

Preferably, the three-dimensional article has a surface roughness Ra, determined according to the JIS B0601 method, which is smaller than 0.4 μm. The three-dimensional article of the present invention has a good appearance to and a smooth touch because the surface of the object is less rough thanks to the influence of the compound (A) contained in the liquid photocurable resin composition.

Furthermore, in case the resin composition is transparent, the produced three-dimensional object has good transparency because the surface, not only the external one but also the internal one, of the three-dimensional object is smooth caused by the influence of said compound (A).

The three-dimensional article of the present invention has a smooth surface so that any long time consuming post-processing steps like polishing can be avoided. In case that a polishing process should be necessary for some reason, the process will be more simplified because the roughness is less pronounced than in articles produced according to the state of the art, especially if the resin does not exploit the hybrid nature of resins which are radically and cationically polymerizable.

DESCRIPTION OF PREFERRED EMBODIMENTS OF THE INVENTION

In the following description, the Applicant provides more detailed embodiments of the invention.

The three-dimensional article of the present invention is preferably produced by repeating the step of curing a thin layer by supplying a controlled amount of light energy to the photocurable liquid resin, supplying the photocurable liquid resin on that cured thin layer, curing this further thin layer by supplying a controlled amount of light energy to the photocurable liquid resin, and repeating the forgoing steps up to obtain the desired article.

During this process of layer-by-layer building, the surface roughness and/or steps between single layers are reduced by the effect of compound (A) contained in the photocurable liquid composition. The detailed mechanism of the effect of this compound (A) is still unknown but it is supposed that the molecule structure of said compound (A) effects the way of light transmission based on the structure or crystallization of the cured article.

In the present document "surface of the three-dimensional article" means the outer surface of the, but also the surface which is in contact with, the non-cured liquid resin composition during the building process of stereolithography. Said compound (A) shows its technical effect (surface smoothing), which is the core of the present invention, when it is used in amounts from 5 to 70 weight % based on the total amount of compounds (A) and (B). Preferably, it is used in amounts from 10 to 50 weight % based on the total amount of compounds (A) and (B). Outside of the above mentioned range, the effect of smoothing the surface is not satisfying. Furthermore, compound (A) can be selected from bi-functional compounds and multi-functional compounds, depending on the expected or desired grade of its effect.

Compound (A) is obtained by the reaction of 2 mol of a hydroxyl group containing (meth)acryl compound with 1 mol of an isocyanate terminated polytetramethyleneglycol compound which is the result of the reaction of 1 mol of linear or branched polytetramethyleneglycol compound with 2 mol of a diisocyanate compound.

Examples of the hydroxyl group containing (meth)acryl compound include, but are not limited to, 2-hydroxyethyl (meth)acrylate, 2-hydroxypropyl (meth)acrylate, 2-hydroxy butyl (meth)acrylate, glycerine di(meth)acrylate, trimethylolpropane di(meth)acrylate and pentaerythritol tri(meth)acrylate.

Examples of the diisocyanate compound include, but are not limited to, tolylene diisocyanate, hexamethylene diisocyanate, 2,2,4-trimethylhexamethylene diisocyanate, isophorone diisocyanate, meta-xylene diisocyanate, and diphenylmethane diisocyanate.

Polytetramethylene glycol residues defining the formula (I) of compound (A) have an average molecular weight from 200 to 3,000 g/mol and the chain can be linear or branched. Preferably, polytetramethylene glycol residues which have an average molecular weight from 400 to 2,000 g/mol are used.

If the average molecular weight is less than 200 g/mol, it is difficult to obtain the surface smooth effect, while if it is over 3,000 g/mol the compound has a high viscosity or is solid so that it is less suitable for the stereolithographic use of liquid resin composition according to the present invention.

As compound (B) of the present invention, thus as a radical polymerizable organic compound different from compound (A), every kind of radical polymerizable and cross-linkable compound can be used. Examples include, but are not limited to, (meth)acrylate, unsaturated polyester, urethane (meth)acrylate other than compound (A), and polythiol compounds. Among them, compounds that contain at least one (meth)acryl group are preferably used, and examples for compound (B) include compounds obtained by reacting epoxy compounds and (meth)acrylic acid, alcohol family (meth)acrylic ester, urethane (meth)acrylates other than compound (A), polyester (meth)acrylate and polyether (meth)acrylate.

As the compound obtained by reacting an epoxy compound and a (meth)acrylic acid, it can be used a (meth) acrylate compound obtained by the reaction of aromatic epoxy compounds, alicyclic epoxy compounds or aliphatic epoxy compounds with (meth)acrylic acid. Examples are (meth)acrylate compounds obtained by the reaction of aromatic epoxy compounds with (meth)acrylic acid including a (meth)acrylate compound obtained by the reaction of glycidyl ether, which is obtained by the reaction of a bisphenol compound such as bisphenol A, bisphenol S or their alkylene oxide adducts with an epoxidizing agent, such as epichlorohydrin, with (meth)acrylic acid.

As the (meth)acrylic acid esters of alcohols, it can be used a (meth)acrylate compound obtained by the reaction of aromatic alcohols, aliphatic alcohols and alicyclic alcohols having at least one hydroxyl group in the molecule and/or their alkylene oxide adducts with (meth)acrylic acid.

More specifically it can be used, for example, 2-ethylhexyl (meth)acrylate, 2-hydroxyethyl (meth)acrylate, 2-hydroxypropyl (meth)acrylate, lauryl (meth)acrylate, stearyl (meth)acrylate, isooctyl (meth)acrylate, tetrahydrofurfuryl (meth)acrylate, isobornyl (meth)acrylate, benzyl (meth) acrylate, 1,4-butanediol-di(meth)acrylate, 1,6-hexanediol-di (meth)acrylate, diethylene glycol-di(meth)acrylate, triethylene glycol-di(meth)acrylate, neopentyl glycol-di(meth) acrylate, polyethylene glycol-di(meth)acrylate, polypropylene glycol-di(meth)acrylate, trimethylolpropane-tri (meth)acrylate, pentaerythritol-tri(meth)acrylate, dipentaerythritol-poly(meth)acrylate [dipentaerythritol-penta (meth)acrylate, dipentaerythritol-hexa(meth)acrylate, etc.], ethoxylated pentaerythritol-tetra(meth)acrylate and (meth) acrylates of an alkylene oxide adduct of a polyhydric alcohol such as diols, triols, tetraol and hexaol.

Among them, (meth)acrylates having two or more (meth) acryl groups in one molecule obtained by reaction of a polyhydric alcohol and (meth)acrylic acid are preferably used.

The expression (meth)acryl or (meth)acrylate means methacryl or acryl or methacrylate or acrylate, methacryl and methacrylate being preferred.

Preferred are compounds (B) which are not epoxy based, to avoid any hybrid character of the photocurable resin composition.

Furthermore, as the urethane (meth)acrylate compounds other than the compound (A), for example, (meth)acrylates obtained by reacting a hydroxyl group-containing (meth) acrylic acid ester with an isocyanate compound can be used. A preferred example of said hydroxyl group-containing (meth)acrylic acid esters is 2-hydroxyethyl(meth)acrylate. Further, as said isocyanate compound, polyisocyanate compounds having two or more isocyanate groups in one molecule, such as tolylene diisocyanate, hexamethylene diisocyanate, 2,2,4-trimethylhexamethylene diisocyanate, isophorone diisocyanate, meta-xylene diisocyanate, diphenylmethane diisocyanate and trimer of isophorone diisocyanate, are preferred.

Furthermore, as the above-mentioned polyester (meth) acrylates, it can be used polyester (meth)acrylates obtained by the reaction of a hydroxyl-containing polyester and (meth)acrylic acid.

Furthermore, as the above-mentioned polyether (meth) acrylates, it can be used polyether (meth)acrylates obtained by the reaction of a hydroxyl-containing polyether and (meth)acrylic acid.

It is possible to use, as the photosensitive radical polymerization initiator (C), any polymerization initiator capable of initiating a radical polymerization of the radical polymerizable organic compound when irradiated with light.

Examples of the photosensitive radical polymerization initiator include phenyl ketone compounds, such as 1-hydroxycyclohexyl phenyl ketone, benzyl or its dialkyl acetal compounds, such as benzyl dimethyl ketal and benzyl-β-methoxyethyl acetal, acetophenone compounds, such as diethoxyacetophenone, 2-hydroxymethyl-1-phenyl-propan-1-one, 4'-isopropyl-2-hydroxy-2-methyl-propiophenone, 2-hydroxy-2-methyl-propiophenone, p-dimethylaminoacetophenone, p-tert-butyl dichloroacetophenone, p-tert-butyl trichloroacetophenone and p-azide-benzalacetophenone, benzoin or its alkyl ether compounds such as benzoin, benzoin methyl ether, benzoin ethyl ether, benzoin isopropyl ether, benzoin n-butyl-ether and benzoin isobutyl ether, benzophenone compounds such as benzophenone, 4,4'-bis-(N,N'-dimethylamino)benzophenone and 4,4'-dichloro-benzophenone, thioxanthone compounds such as thioxanthone, 2-methyl thioxanthone, 2-ethyl thioxanthone, 2-chloro thioxanthone and 2-isopropylthioxanthone, and the like. The photocurable resin composition of the present invention can further contain photosensitizers (polymerization promoters) and/or reactive diluents. Examples of photosensitizers include amine compounds such as triethanolamine, methyl diethanolamine, triethylamine, and diethylamine thioxanthone, derivatives of thioxanthone, anthraquinone, derivatives of anthraquinone, anthracene, derivatives of anthracene, perylene, derivatives of perylene, benzophenone, benzoin isopropyl ether and the like.

The content of compound (C) in the composition of the present invention, based on the total amount of 100 parts per weight of compounds (A) and (B) of the composition, is usually from 0.1 to 10 parts per weight, preferably from 0.2 to 7 parts per weight, more preferably 0.5-5 parts per weight.

If the content of compound (C) is less than 0.1 parts per weight based on 100 parts per weight of compounds (A) and (B), the radiation-curability of the resin composition is low and it is difficult to manufacture a three-dimensional article having sufficient mechanical strength. On the other hand, if it exceeds 10 parts per weight, in the case of the resin composition for stereolithography, it becomes difficult to control the proper light transmission properties and the accuracy of the obtained three-dimensional article is reduced.

The photocurable resin composition of the present invention can further contain a compound (D) consisting of one or more fillers and/or one or more modifying resins. In this case, compound (D) can be used from 5 to 60 parts per weight based on the total amount of the compounds (A), (B) and (C). As the filler, inorganic particles/powders such as silica, glass, ceramics or metal powders can be used. As the modifying resin, thermoplastic resins, thermosetting resins, rubber resins and elastomeric resins can be used. Among these, silica particles, glass powder or glass particles and ceramic powder/particles such as zirconia, alumina and titanium oxide are preferably used. The size of these particles should be smaller than the layer thickness. Preferably, the size is from a few tens of nm to several μm.

In the three-dimensional article of the present invention (without any polishing process), the surface roughness Ra is generally 0.4 μm or less, preferably 0.3 μm or less, more preferably 0.2 μm or less. These surface roughness values are less than those obtainable in three-dimensional articles obtained by stereolithography using conventional compositions known in the state of the art, which generally vary from 0.5 μm to 1.0 μm. The surface roughness Ra in this document is intended to be determined according to the JIS B0601 method.

By using the photocurable resin composition according to the invention, a three-dimensional article in the sense of the present invention is produced. As the method of fabrication, the conventional stereolithography method can be used, where a three-dimensional object is produced by repeating the step of curing a thin layer by supplying a controlled amount of light energy to the photocurable liquid resin, supplying the photocurable liquid resin on that cured thin layer and curing this new thin layer by supplying the controlled amount of light energy in the photocurable liquid resin from above, or by the so-called regulated liquid surface stereolithography, in which a liquid photocurable resin composition is accommodated in a shaping container having a light permeable bottom face and repeating the step of curing a thin layer by supplying a controlled amount of light energy from the bottom across the bottom face, supplying further photocurable liquid resin between that cured thin layer and the bottom face, forming a thin layer of liquid photocurable resin, and curing this thin layer by supplying the controlled amount of light energy to the photocurable liquid resin. In the present invention the latter method embodiment is preferred because it better realizes the effect of compound (A), namely clearly higher surface smoothness and less surface roughness. In case the resin composition is transparent, the three-dimensional object produced by the above mentioned method has better transparency than the conventional one.

A three-dimensional article obtained by the above mentioned method should preferably be cleaned. As a cleaning agent, alcohol-based organic solvents, such as isopropyl alcohol and ethyl alcohol, and/or ketone-based organic solvents, such as acetone, ethyl acetate and methyl ethyl ketone and/or aliphatic organic solvents such as terpene can be used.

After cleaning, it is preferable to perform post-curing by heat irradiation or light irradiation. Post-curing completely cures the surface, as well as it cures unreacted resin composition which may have remained inside the three-dimensional article.

Suitable light sources to produce the three-dimensional article can be ultraviolet rays, electron rays, X-rays, gamma rays and microwaves and among them ultraviolet rays and light in the near UV which have a 300-450 nm wavelength are preferably used from the effective and economical point of view. In this case, as a light source, a laser beam (for example, from a semiconductor excitation solid laser capable of emitting ultraviolet light, an Ar laser, a He—Cd laser, an ultraviolet laser), a high-pressure mercury lamp, an ultrahigh-pressure mercury lamp, a low-pressure mercury lamp, a xenon lamp, a halogen lamp, a metal halide lamp, an ultraviolet LED lamp, an ultraviolet fluorescent lamp, and the like can be used.

To form each cured resin layer to produce the cured article, it is possible to employ the light converted to a spot shape, such as a laser beam, and using a line drawing method, or light passed through a planar drawing mask formed by arranging a plurality of micro-optical shutters such as a liquid crystal shutter or a digital micro-mirror device (DMD).

Features described with reference to one aspect of the invention may be transferred mutatis mutandis to any other aspect of the invention.

DESCRIPTION OF PREFERRED EXAMPLES

The present invention will be specifically described below by way of Examples, but the present invention is not limited to these Examples.

In the following Examples, the measurement of the surface roughness Ra of the three-dimensional articles obtained by stereolithography according to the invention was carried out as follows: the surface roughness Ra was obtained based on the JIS B0601 method using the measurement value from a surface shape measuring device, here DEKTAK3 by ULVAC Co., Ltd.

The liquid photocurable resin compositions were prepared as follows: the liquid resin compositions of Examples 1-6 and of Comparative Examples 1-2 were prepared mixing the compounds based on the formulations shown in Table 1. The mixtures were stirred at room temperature for 3 hours using a stirring container.

TABLE 1

| | Compound | Ex. 1 | Ex. 2 | Ex. 3 | Ex. 4 | Ex. 5 | Ex. 6 | Comp. Ex. 1 | Comp. Ex. 2 |
|---|---|---|---|---|---|---|---|---|---|
| A | UA-1[1] | 50 | 10 | | | 20 | 10 | | 80 |
| | UA-2[2] | | | 40 | | | | | |
| | UA-3[3] | | | | 40 | | | | |
| B | B-1[4] | 25 | 65 | | | 30 | 65 | 80 | |
| | B-2[5] | | | 30 | 30 | 25 | | | |
| | B-3[6] | 25 | 25 | 30 | 30 | 25 | 25 | 20 | 20 |
| C | Initiator[7] | 2 | 2 | 2 | 2 | 2 | 2 | 2 | 2 |
| D | Silica particles[8] | | | | | | 50 | | |
| Parameter | | | | | | | | | |
| | Viscosity mPa·s | 4800 | 900 | 3000 | 3100 | n.d. | 5800 | 500 | 7000 |
| | Modelling | Good | Very good | Good | Good | n.d. | Good | Very good | Bad |
| | Surface smoothness | Very good | Very good | Very good | Very good | Very good | Very good | Bad | Bad |
| | Surface roughness/ [μm] | 0.3 | 0.2 | 0.2 | 0.3 | 0.3 | 0.1 | 1.0 | 0.6 |
| | Transparency | Very good | Very good | Good | Good | Very good | Opaque | Bad | Bad |
| | Accuracy | Very good | Very good | Very good | Very good | Very good | Very good | Mediocre | Mediocre |

The amounts indicated in Table 1 are expressed as parts per weight.
[1]UA-1 = urethane dimethacrylate ("UA-160TMM", manufactured by Shin Nakamura Chemical Co., Ltd.)
[2]UA-2 = urethane dimethacrylate ("UA-150TMM", manufactured by Shin Nakamura Chemical Co., Ltd.)
[3]UA-3 = urethane dimethacrylate ("UA-L160TMM", manufactured by Shin Nakamura Chemical Co., Ltd.)
[4]B-1 = urethane dimethacrylate ("U-2TH", manufactured by Shin Nakamura Chemical Co., Ltd.) obtained by the reaction of 1 mol of 2,2,4-trimethylhexamethylene diisocyanate with 2 mol of 2-hydroxyethyl methacrylate
[5]B-2 = neopenthylglycol dimethacrylate ("NK-NPG", manufactured by Shin Nakamura Chemical Co., Ltd.)
[6]B-3 = triethyleneglycol dimethacrylate ("NK-3G", manufactured by Shin Nakamura Chemical Co., Ltd.)
[7]Initiator = Irgacure ® TPO (BASF)
[8]Silica particles = Admafine Silica (Admatechs), average particle diameter 5 μm.

By using the compositions of the present invention, it is possible to produce a three-dimensional article with little roughness on the surface, excellent surface smoothness and high dimensional and shape precision.

INDUSTRIAL APPLICABILITY

The composition of the present invention is suitably used for stereolithography. The composition of the present invention is suitably used in applications where the smoothness of the surface is particularly necessary, and where high precision is needed.

The invention claimed is:

1. Method for producing a three-dimensional article by stereolithography, wherein the three-dimensional article is produced from a liquid photocurable resin composition for stereolithography, comprising:
   (i) at least one radical polymerizable compound (A) represented by the following general formula (I)

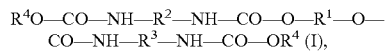
   $$R^4O-CO-NH-R^2-NH-CO-O-R^1-O-CO-NH-R^3-NH-CO-OR^4 \text{ (I)},$$

wherein $R^1$ is a linear or branched polytetramethylene glycol residue having an average molecular weight from 200 to 3,000 g/mol; $R^2$ is a diisocyanate compound residue; $R^3$ is a diisocyanate compound residue being the same as or different from $R^2$; and $R^4$ is selected from AcrO—CH$_2$—CH$_2$—, (AcrO—CH$_2$)$_2$CH—, (AcrO—CH$_2$)$_3$C—CH$_2$—, AcrO—CH$_2$—CHCH$_3$—, AcrO—CH$_2$—CHC$_2$H$_5$— and (AcrO—CH$_2$)2C(C$_2$H$_5$)CH$_2$—, preferably from AcrO—CH$_2$—CH$_2$— and (AcrO—CH$_2$)$_2$CH—, more preferably is AcrO—CH$_2$—CH$_2$—; wherein Acr is CH$_2$=C(R)—CO— and R is a hydrogen atom or a methyl group;
   (ii) at least one radically polymerizable organic compound (B) different from compound (A); and
   (iii) a photosensitive radical polymerization initiator (C), wherein the content of said radical polymerizable compound (A) varies from 5% to 70% by weight based on the total amount of compounds (A) and (B), wherein the liquid photocurable resin composition has a viscosity between 900-5800 mPA·s, which is cured layer by layer by irradiating the layers selectively with light.

2. Method for producing a three-dimensional article made from a liquid photocurable resin composition, having a viscosity between 900-5800 mPa·s, of the follow formula (I)

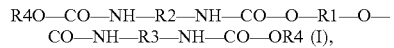
   $$R4O-CO-NH-R2-NH-CO-O-R1-O-CO-NH-R3-NH-CO-OR4 \text{ (I)},$$

wherein R1 is a linear or branched polytetramethylene glycol residue having an average molecular weight from 200 to 3,000 g/mol; R2 is a diisocyanate compound residue; R3 is a diisocyanate compound residue being the same as or different from R2; and R4 is selected from the group consisting of AcrO—CH2—CH2—; (AcrO—CH2)2CH—; (AcrO—CH2)3C—CH2—; AcrO—CH2—CHCH3—, AcrO—CH2—CHC2H5— and (AcrO—CH2)2C(C2H5)CH2—, wherein Acr is CH2=C(R)—CO— and R is a hydrogen atom or a methyl group in a layer-by-layer stereolithographic process comprising the steps of:
   accommodating a layer of the liquid photocurable resin composition in a shaping container having a light permeable bottom face;
   irradiating said layer from the bottom of the container curing the layer; and
   repeating said steps accommodating further layers of liquid photocurable resin composition to be cured between the bottom of said container and the last cured layer to produce a stereoscopically shaped article.

3. The method for producing a three-dimensional article by stereolithography according to claim 1, wherein the liquid photocurable resin composition further comprises 0.1-10 parts per weight of compound (C) based on the total amount of compounds (A) and (B).

4. The method for producing a three-dimensional article by stereolithography, according to claim 1, wherein the compound further comprises as compound (D), from 5 to 60 parts per weight based on 100 parts per weight of compounds (A), (B) and (C), at least one filler or modifier resin.

5. The method for producing a three-dimensional article by stereolithography, according to claim 1, wherein the article in its cured form has a surface roughness Ra, determined according to the JIS B0601 method, which is lower than 0.4 μm.

* * * * *

UNITED STATES PATENT AND TRADEMARK OFFICE
CERTIFICATE OF CORRECTION

PATENT NO. : 11,042,088 B2  
APPLICATION NO. : 16/069825  
DATED : June 22, 2021  
INVENTOR(S) : Tsuneo Hagiwara and Satoshi Iketani Page 1 of 1

It is certified that error appears in the above-identified patent and that said Letters Patent is hereby corrected as shown below:

In the Claims

In Claim 2, at Column 11, Line 33, delete the word "follow" and insert the word --following--, therefor.

Signed and Sealed this  
Third Day of August, 2021

Drew Hirshfeld  
*Performing the Functions and Duties of the*  
*Under Secretary of Commerce for Intellectual Property and*  
*Director of the United States Patent and Trademark Office*